United States Patent
Claret et al.

(10) Patent No.: US 10,983,093 B2
(45) Date of Patent: Apr. 20, 2021

(54) RESONANT CHEMICAL SENSOR COMPRISING A FUNCTIONALISATION DEVICE AND METHOD FOR THE PRODUCTION THEREOF

(71) Applicant: COMMISSARIAT A L'ENERGIE ATOMIQUE ET AUX ENERGIES ALTERNATIVES, Paris (FR)

(72) Inventors: Thierry Claret, Pierre Chatel (FR); Frederic Bottausci, Saint-Aygulf (FR); Guy-Michel Parat, Claix (FR); Severine Vignoud, Bernin (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 222 days.

(21) Appl. No.: 16/319,529

(22) PCT Filed: Jul. 25, 2017

(86) PCT No.: PCT/FR2017/052050
§ 371 (c)(1),
(2) Date: Jan. 22, 2019

(87) PCT Pub. No.: WO2018/020130
PCT Pub. Date: Feb. 1, 2018

(65) Prior Publication Data
US 2020/0240953 A1 Jul. 30, 2020

(30) Foreign Application Priority Data
Jul. 28, 2016 (FR) .................. 16 57301

(51) Int. Cl.
*G01N 29/02* (2006.01)
*G01N 29/036* (2006.01)

(52) U.S. Cl.
CPC ......... *G01N 29/022* (2013.01); *G01N 29/036* (2013.01); *G01N 2291/014* (2013.01);
(Continued)

(58) Field of Classification Search
CPC .............. G01N 29/022; G01N 29/036; G01N 2291/014; G01N 2291/021;
(Continued)

(56) References Cited

U.S. PATENT DOCUMENTS

2003/0096424 A1   5/2003  Mao et al.
2003/0124332 A1   7/2003  Mao et al.
(Continued)

FOREIGN PATENT DOCUMENTS

WO    WO 02/095940 A1    11/2002
WO    WO 2008/040769 A1    4/2008
(Continued)

OTHER PUBLICATIONS

International Search Report dated Oct. 16, 2017 in PCT/FR2017/052050 filed on Jul. 25, 2017.
(Continued)

*Primary Examiner* — Benjamin R Schmitt
(74) *Attorney, Agent, or Firm* — Oblon, McClelland, Maier & Neustadt, L.L.P.

(57) ABSTRACT

A chemical sensor including at least one resonant detection structure, the detection structure including at least one layer based on a porous material, the pores of which are covered with at least one functionalization layer that can adsorb or absorb at least one chemical species.

13 Claims, 7 Drawing Sheets

(52) U.S. Cl.
CPC ............... *G01N 2291/021* (2013.01); *G01N 2291/0257* (2013.01)

(58) Field of Classification Search
CPC ... G01N 2291/0257; G01N 2291/0255; G01N 2291/0256; B81B 2201/0214; B81C 1/00206
See application file for complete search history.

(56) References Cited

U.S. PATENT DOCUMENTS

| | | |
|---|---|---|
| 2004/0133348 A1 | 7/2004 | Kalantar-Zadeh et al. |
| 2006/0104864 A1 | 5/2006 | Fu |
| 2006/0280931 A1 | 12/2006 | Mao et al. |
| 2009/0156426 A1* | 6/2009 | Schiestel .......... G01N 33/54353 506/11 |
| 2015/0129538 A1 | 5/2015 | Grange et al. |
| 2016/0327518 A1 | 11/2016 | Matheron et al. |

FOREIGN PATENT DOCUMENTS

| | | |
|---|---|---|
| WO | WO 2013/171144 A1 | 11/2013 |
| WO | WO 2015/097282 A1 | 7/2015 |

OTHER PUBLICATIONS

Hohkawa, K. et al., "Piezoelectric Sensor using A Porous Alumina Film covered with A Catalytic Material," IEEE Ultrasonic Symposium, 1998, 513-516.

Varghese, O. K. et al., "Ammonia Detection using Nanoporous Alumina Resistive and Surface Acoustic Wave Sensors," Sensors and Actuators, vol. 94, 2003, 27-35.

Bernardin, T. et al., "Organized Porous Alumina Membranes for High Density Silicon Nanowires Growth," Microelectronic Engineering, vol. 88, 2011, 2844-2847.

* cited by examiner

RESONANT CHEMICAL SENSOR COMPRISING A FUNCTIONALISATION DEVICE AND METHOD FOR THE PRODUCTION THEREOF

TECHNICAL FIELD AND PRIOR ART

This application relates to the field of mechanical transduction chemical sensors, and in particular those dedicated to the detection of chemical species in gaseous form. It relates more particularly to the implementation of resonant chemical sensors and/or provided with improved means of piezoelectric transduction.

The operating principle of a mechanical transduction sensor is based on the setting into oscillation of an element of which the vibratory frequency depends on a chemical species to be quantified.

Chemical sensors of the acoustic resonator type are based on a measurement of a variation in the resonant frequency of the sensor or more rarely on a phase shift measurement. These sensors are obtained by covering a face of a transducer of the acoustic resonator type, for example a piezoelectric transducer provided with a sensitive layer based on a material that can adsorb and/or absorb the chemical species to be detected.

When one or several species to be detected interacts with the sensitive layer, the mass of the sensitive layer increases, which causes a drop in the resonant frequency of the transducer. The mass adsorbed on the sensitive layer therefore induces a change in the resonant frequency of the transducer, which can be measured. In certain cases, it is the phase shift of the acoustic resonator which is used for the measurement.

There are resonant chemical sensors of which the sensitive layer is organic and in particular based on a polymer material.

The integration of such a layer into a detection structure of a sensor can be complex because certain organic materials are difficult to structure and are not in particular adapted to a structuring by photolithography.

Moreover, a sensitive layer made of polymer material can be degraded which can limit the service life of the sensor.

Furthermore, with certain materials such as for example polyvinylalcohol, poly(hydroxy)styrene, polyimide, polyethylene oxide and polyvinylcarbazole these same polymers incompatible with a step of stripping of usual lithography and associated method of production it may be difficult to obtain a sensitive layer of uniformed and/or controlled thickness.

The document: "Piezoelectric sensor using a porous alumina film covered with a catalytic material", by K. Hohkawa, et al., IEEE Ultrasonic Symp. Proc. 1 (1998) 513-516 presents moreover a resonant gas sensor of the SAW type (for "Surface Acoustic Waves") provided with a porous sensitive structure associated with an inorganic catalytic layer. This sensor is intended to trap gases such as CO by reaction with the catalytic layer of the Pt or Co type deposited on the porous alumina structure.

The document "Ammonia detection using nanoporous alumina resistive and surface acoustic wave sensors", by Oomman K. Vargehse et al., Sensors and actuators, 2003, also presents a SAW sensor with a sensitive structure made from alumina, applied here to the detection of ammonia.

There is the problem of carrying out an improved chemical sensor with regards to the disadvantages mentioned above.

DISCLOSURE OF THE INVENTION

An embodiment of this invention provides for a chemical sensor provided with at least one mechanical transduction detection structure, said detection structure being provided with at least one layer based on a porous material with pores filled or covered with at least one first layer based on a first material able to adsorb or absorb at least one first chemical species.

Using a porous material used as a receiving matrix of a first material able to absorb and/or adsorb at least one chemical species of interest allows for a wide choice of first material and possibly to use a first material that is more fragile than the porous material forming the matrix.

The invention thus makes it possible to use organic functionalisation material and to produce an improved sensor in terms of robustness and service life.

The porous material can be also a material of which the dimensions can easily be controlled and wherein a material of which the structuring is more difficult to control is integrated.

The porous material can be for example porous alumina or porous silicon.

The first material can be in particular a microporous or nanoporous organic material.

The first material can be chosen from the following materials: organic-inorganic hybrid material, polymer material.

The term "microporous" means a pore size less than 2 nanometres.

The term "nanoporous" means a pore size less than 1 nanometre.

The size of the pores, in terms of this invention, corresponds to the largest dimension (the largest dimensions of the volume of the cavity defined by the pore) of said pores.

It is moreover understood that the dimensions of a pore (depth and/or width) can be measured by TEM (Transmission Electronic Microscopy) or by the BET technique (Brunauer, Emmett and Teller).

Advantageously, the first material is microporous or nanoporous and has an organic function based on silane (for example 11-pentafluorophenoxyundecyltrimethoxysilane) or based on microporous silica rendered organic, for example by a silanisation treatment.

Advantageously, the porous material comprises pores filled furthermore with at least one second layer arranged on and in contact with the first layer, the second layer being based on a second material, different from said first material and able to adsorb or absorb at least one second chemical species different from the first chemical species. With such a configuration, a detection of several different chemical species with the same sensor can advantageously be implemented.

The second material is typically an organic material.

The second material can be chosen from the following materials: organic-inorganic hybrid material, microporous or nanoporous material, polymer material.

The chemical sensor is in particular suitable for the detection of gas.

According to an embodiment, the chemical sensor comprises a functionalisation layer suitable for adsorbing or absorbing $CO_2$, and at least one other layer among said functionalisation layers suitable for adsorbing or absorbing $H_2$.

According to another embodiment, the chemical sensor comprises a functionalisation layer suitable for adsorbing or absorbing an organic compound of the BTEX type (Benzene, Toluene, Ethylbenzene and Xylenes).

Advantageously, the porous material can be coated with a closure layer of the pores, the closure layer covering the functionalisation layer or layers and being suitable, in terms of composition and thickness to allow one or several chemical species to penetrate inside the pores and to prevent one or several other chemical species from penetrating inside the pores. The closure layer thus has a selective permeability.

According to an embodiment, a closure layer is provided that is either hydrophobic in order to prevent water molecules from penetrating into the pores, or filtering in relation to certain molecules in order to provide a discrimination of the molecules that have affinity with the functionalisation materials. As an example of a hydrophobic layer, Silane FDTS can be used.

This invention applies very particularly to a sensor provided with a resonant and/or piezoelectric transduction detection structure.

According to another aspect, this invention relates to a method for producing a sensor such as defined hereinabove.

An embodiment of such a method provides in particular for the formation of the first functionalisation layer using at least one liquid phase deposition of a liquid solution on the layer of porous material.

It is as such easy to integrate into a porous matrix a sensitive material, for example made of polymer, able to absorb and/or adsorb at least one chemical species of interest.

It is possible in particular to integrate a material that is incompatible with a method of lithography into a porous material which can have been structured beforehand. In this case, the porous material can be subjected to a method of lithography before receiving the filling material or materials of the pores. Patterns can thus be defined in the porous material in a manner similar to a conventional method of lithography, then the deposition of one or several filling materials that are sensitive to one or several chemical species to be detected but which are more fragile or difficult to model than the porous material.

A method of filling the porous material comprises a step of rotating a support on which the layer of porous material is arranged.

It is also possible to provide a filling by using a scraper to spread out said liquid solution over the porous material.

When it is desired to integrate several functionalisation layers within pores of the porous material, the formation can be provided of a first functionalisation layer by compliant deposition in such a way as to cover the walls of the pores while leaving at least one empty volume in the pores. The pores are then filled with a second material in such a way as to form in said volume at least one second functionalisation layer arranged on and in contact with the first functionalisation layer.

The porous material can be for example formed from an aluminium layer whereon is carried out an oxidation via anodisation. Porous alumina can thus be formed.

Advantageously, it can be provided that the layer rendered porous is arranged on an oxidation barrier layer in order to stop the porosification. For example when the porous material is formed by porosification of a layer arranged on an electrode of the sensor, an intermediate barrier layer makes it possible to prevent a porosification of the electrode.

BRIEF DESCRIPTION OF THE DRAWINGS

This invention shall be better understood when reading the description of given embodiments, solely for the purposes of information and in no way limiting, in reference to the accompany drawings wherein.

Identical, similar or equivalent portions of the various figures bear the same numerical references so as to facilitate the passing from one figure to the other.

The various portions shown in the figures are not necessarily shown on a uniform scale, in order to render the figures more legible.

Furthermore, in the description hereinafter, terms that depend on the orientation, such as "front", "rear", "upper", "lower" etc. of a structure are applied in considering that the structure is oriented such as shown in the figures.

DETAILED DESCRIPTION OF PARTICULAR EMBODIMENTS

Figure 1:
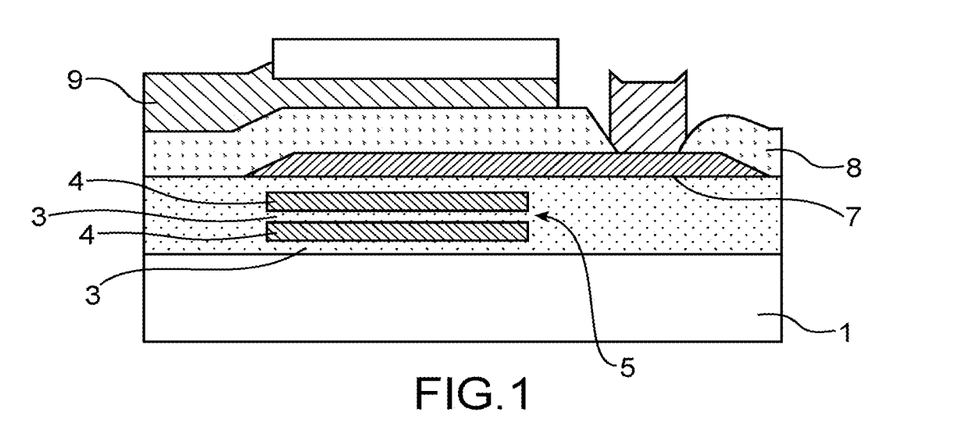
FIG. 1 shows an example of a gas sensor of the BAW type provided with a resonant detection structure with a porous material that integrates at least one functionalisation layer in its pores.

Reference is now made to FIG. 1 giving an example of a chemical sensor implemented according to an embodiment of this invention. The sensor is provided with an electromechanical transduction detection structure, i.e. sensitive to variations in the mechanical stresses on the latter or the mass of the latter, generated when molecules, in particular in the form of gas, are absorbed by or adsorbed on the detection structure. The detection structure is for example based on a piezoelectric material.

The sensor shown according to a cross-section view is here of the resonant type i.e. with a mechanical resonant frequency sensitive to the variations in the mass of the detection structure according to the quantity of molecules absorbed by or adsorbed on the detection structure.

In this particular embodiment, the chemical sensor is with volume acoustics waves (BAW for "Bulk Acoustic wave")

with a piezoelectric detection structure formed from a lower electrode 7 and from an upper electrode 9 between which a layer of piezoelectric material 8 is arranged. The piezoelectric material 8 is for example AlN, while it is possible to provide a lower electrode 7 for example made from Molybdenum. The upper electrode 9 is made from a conductive material advantageously able to be rendered porous such as Aluminium.

When an oscillating electric field is applied to the piezoelectric layer by application of a difference in potential between the lower electrode 7 and the upper electrode 9, this results in a mechanical disturbance in the form of acoustic waves.

These waves propagate in the resonator characterised by its resonance frequency according to the piezoelectric material 8 and the mass of the various layers that form the stack.

For the purpose of having a relation between the adsorbed or adsorbed mass of chemical species and the substance detected, a highly selective detection structure is provided, provided with a functionalised porous material 11, i.e. provided with a coating able to absorb and/or adsorb at least one particular chemical species. The functionalised porous material 11 is here arranged on the upper electrode 9 or formed in a portion of the upper electrode 9.

The resonant detection structure is arranged on a support 1, for example on a semiconductor substrate, typically made of silicon.

A means of acoustic insulation in the form of an acoustic reflector is provided between the resonant detection structure and the substrate 1. In this example, the BAW resonator is isolated from the substrate by an acoustic reflector 5 in the form of a Bragg mirror. Such a reflector 5 is typically formed from an alternating stack of first layers 3 made from a material with a low acoustic impedance and second layers 4 made from a material with high acoustic impedance. A Bragg mirror is chosen for example formed from an alternation of electrically-conductive material and of insulating material. For example, the first layers 3 are made of silicon oxide and the second layers 4 are made of tungsten.

Figure 2:
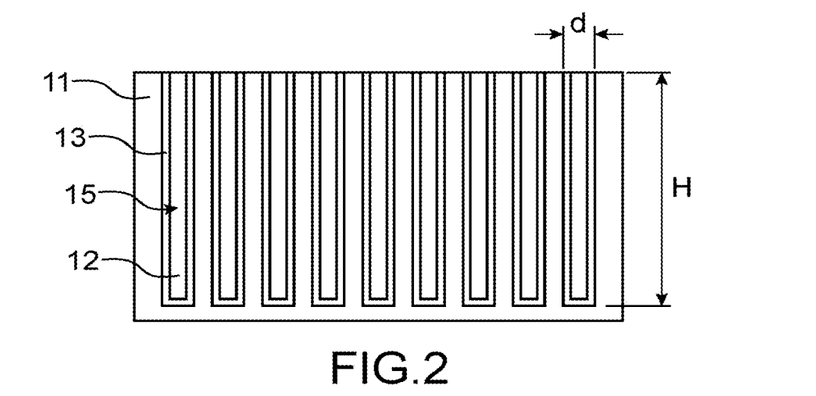
FIG. 2 shows an example of a configuration of porous material integrated into a detection structure of a sensor, the porous material having pores comprising several functionalisation layers each one suitable for the absorption or adsorption of a given chemical species.

A configuration example of the functionalised porous material 11 integrated into the detection structure is given diagrammatically in FIG. 2.

The porous material 11 can be formed by porosification of the material of the upper electrode 9, for example porous alumina produced by a method of porosification of aluminium. Alternatively, the porous material is formed by porosification of a material covering the upper electrode 9 and different from the one of this electrode 9, for example silicon or silicon oxide or titanium oxide.

The porous material 11 comprises typically pores 12 with an aspect ratio H/d, i.e. of height H over the critical dimension d, high, i.e. of at least 10. The term "critical dimension" d here means the smallest dimension of the pores other than their height H, the height H being a dimension measured orthogonally to the main plane of the porous layer, in other words orthogonally to the plane [0; x; y] of the coordinate system [0; x; y; z] given in FIG. 2. For example, the aspect ratio H/d is typically between 10 and several hundred.

At least one functionalisation layer is provided inside the pores 12, the latter being delimited by a wall that is covered with this functionalisation layer. The functionalisation layer is configured to adsorb and/or absorb one or several chemical species that the chemical sensor is to detect.

Several different functionalisation layers per pore can advantageously be provided. In the configuration example given in FIG. 2, a first functionalisation layer 13 able to adsorb and/or absorb at least one first chemical species and a second functionalisation layer 15 able to adsorb and/or absorb at least one second chemical species different from the first chemical species are as such co-integrated into the same pores 12, the second functionalisation layer 15 being arranged on and in contact with the first functionalisation layer 13.

According to a possible arrangement of the functionalisation layers 13, 15 the first functionalisation layer 13 covers the walls of the pores 15 while the second functionalisation layer 15 occupies the remaining volume of the pores 12. The first chemical species and the second chemical species to be detected can be in the form of a gas. In this case, the pores 12 are provided with a functionalisation layer suitable for absorbing a gas and another functionalisation layer suitable for absorbing another gas.

A particular application of the chemical sensor can be for example the detection of $CO_2$ and of $H_2$. For example, a functionalisation layer based on silane and of the EHTES type (2(3, 4 epoxy cyclohexyl) ethyl triethoxy silane) or of the PFO-U-TMS type (i.e. 11-pentafluorophenoxyundecyltrimethoxysilane) or microporous silica that has undergone an HMDS (hexamethyldisilazane) or PVPh treatment (poly (4-vinylphenol)) is suitable for the detection of $CO_2$. Another functionalisation layer based on a material different from the one of the first layer and which can be for example based on Silane and of the APTES (3-Aminopropyl)triethoxysilane) or EHTES type, or an organic inorganic hybrid material such as SiOC, or microporous silica functionalised by EBTMOS (3,4-epoxybutyltrimethoxysilane) or APTES is suitable for the detection of $H_2$.

Figure 3:
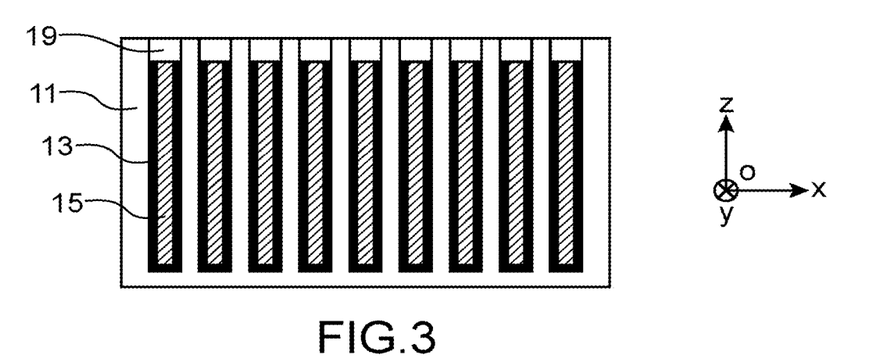
FIG. 3 shows an alternative porous structure with pores integrating functionalisation layers and which are closed by the intermediary of a closure layer.

An alternative arrangement of the functionalised porous structure is given in FIG. 3 and provides for the integration of an encapsulation layer also called closure layer 19 arranged at the mouth of the pores 12 in such a way as to seal them. The closure layer 19 is configured in terms of arrangement and composition in such a way as to prevent certain chemical species from penetrating into the pores 12, while still allowing the first chemical species and the second chemical species to be detected to pass through this layer 19 and be introduced into the pores 12. According to a particular embodiment, the closure layer 19 can be hydrophobic and suitable for making it possible to prevent water molecules from reaching the pores 12. An example of a material for a hydrophobic closure layer that allows carbon dioxide ($CO_2$) to penetrate into the pores 12 is silane FDTS (1H, 1H,2H,2H-Perfluorodecyltrichlorosilane).

Figure 4:
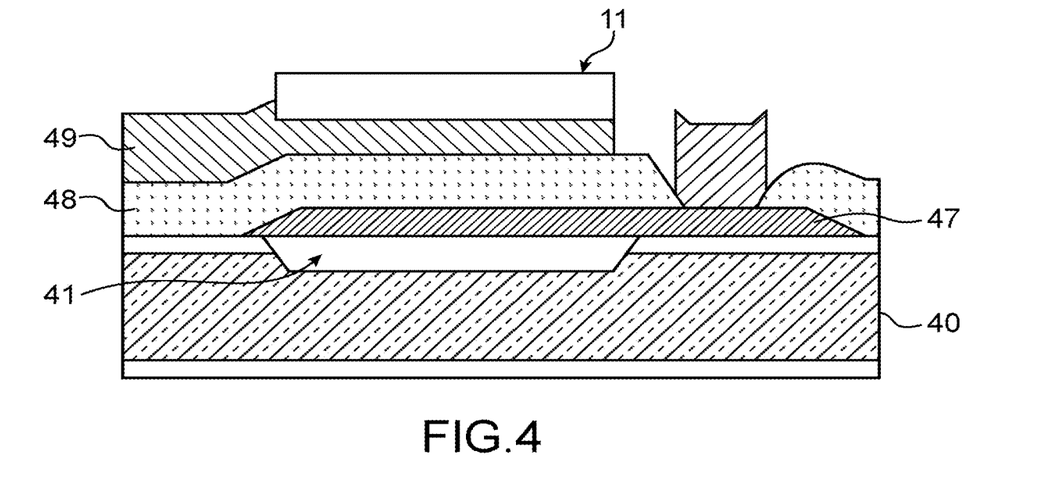
FIGS. 4 and 5 show different examples of resonant gas sensors of the FBAR type with a resonant detection structure provided with a functionalised porous material.

Another example of an acoustic wave resonant sensor, this time of the FBAR type (for "film bulk acoustic resonator"), is given in FIG. 4.

This sensor differs from the one described hereinabove in particular in that it is provided with a detection structure suspended above a cavity 41. The cavity 41 can be defined between the lower electrode 47 of a piezoelectric transduction detection structure and an upper face of a substrate 40 on which portions of the detection structure is arranged. The piezoelectric detection structure is formed from a stack comprising a layer of piezoelectric material 48 such as AlN whereon the upper electrode 49 is arranged, the layer of piezoelectric material 48 being itself arranged on a lower electrode 47. In this type of stack, a dielectric layer can be provided under the lower electrode 47 in order to protect the electrode at the time of the etching of the cavity 41. This dielectric layer is continuous over the entire piezoelectric structure and can be stored in the final stack. Such a dielectric layer can be for example based on SiN, or $SiO_2$, or AlN.

Figure 5:
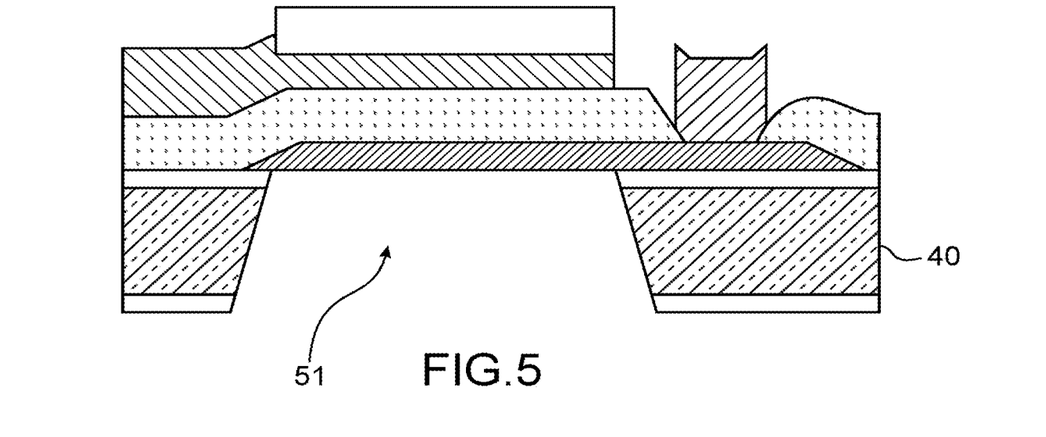

The cavity 41 can extend in a portion of the substrate 40 or pass through the substrate 40 as in the alternative shown in FIG. 5.

Figure 6:
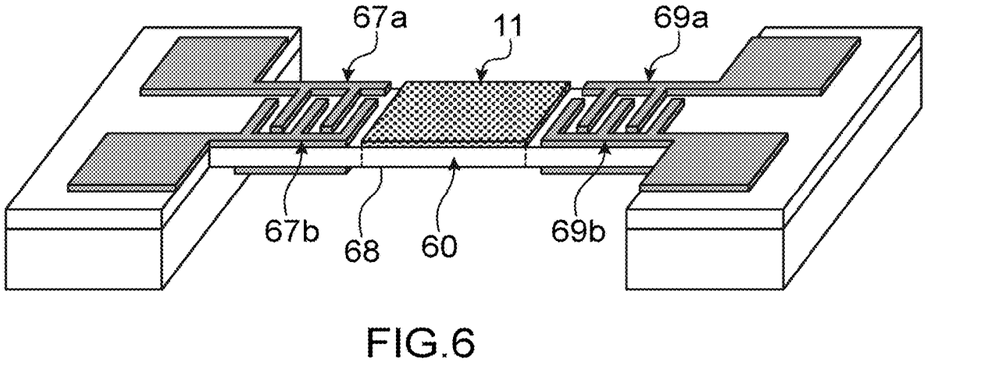
FIG. 6 shows another example of a chemical sensor of the Lamb wave type, detection structure comprising a piezoelectric transducer and a porous and functionalised sensitive material.

Another embodiment of a resonant chemical sensor based on Lamb waves is given in FIG. 6.

In this example, the functionalised porous material 11 is arranged on a suspended beam 60 made of piezoelectric material, and placed on the path of acoustic waves emitted by acoustic wave emitting electrodes 67a, 67b and received by acoustic wave receiving electrodes 69a, 69b.

The emitting electrodes 67a, 67b have the form of interdigitated combs arranged at a first end of the beam, which the receiving electrodes 69a, 69b also have the form of interdigitated combs arranged at a second end of the beam 60, opposite the first end. The stress applied on the beam 60 varies according to the quantity of chemical species to be detected present on the porous material 11, this variation being transmitted by a variation in the electrical signal at the terminals of the receiving electrodes 69a, 69b.

Figure 7A:
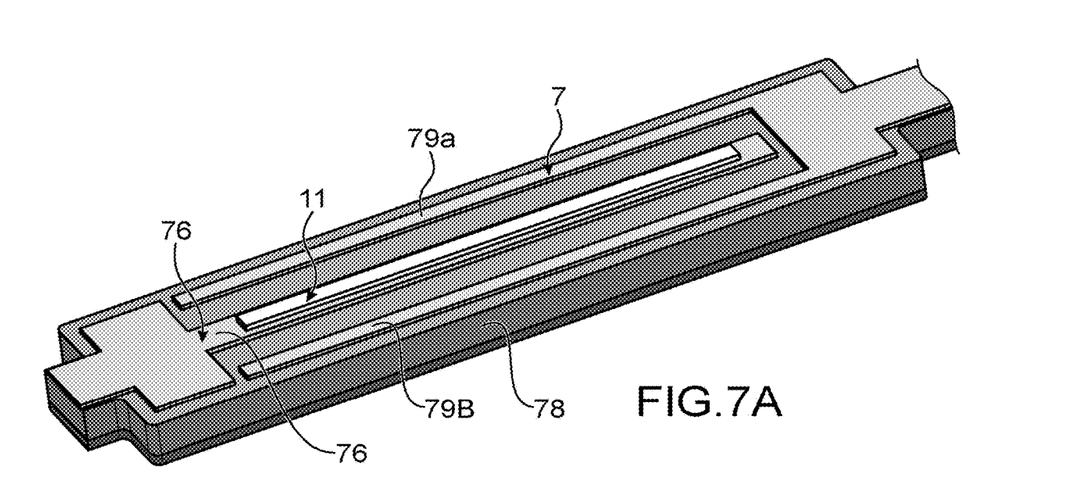
FIGS. 7A-7B show an example of a chemical sensor of the Lamb wave type comprising a resonant detection structure provided with a functionalised porous material.
Figure 7B:
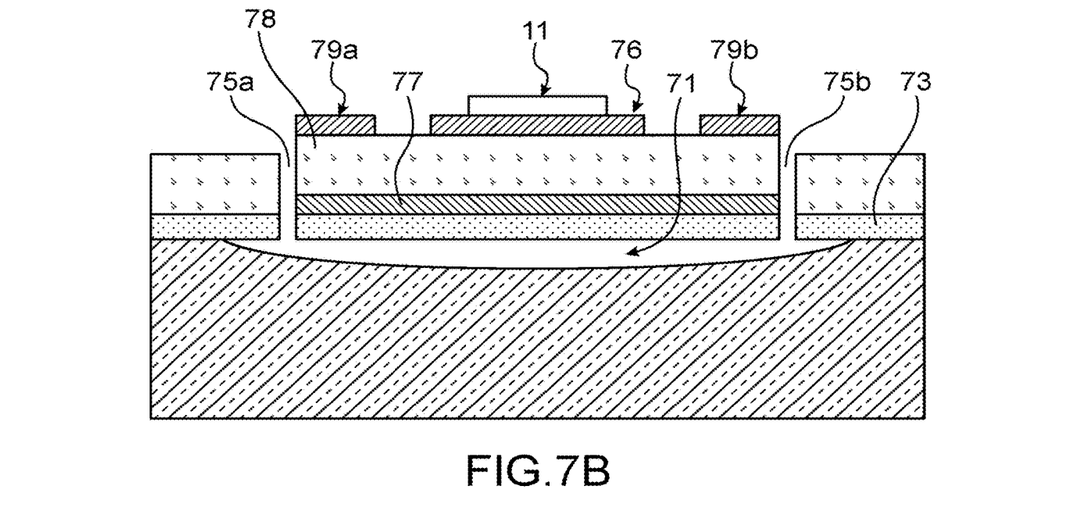

Another example of a Lamb wave resonant sensor is shown in FIGS. 7A-7B. The detection structure is also suspended above a cavity 71. The block of functionalised porous material 11 is this time arranged on an electrode 76, for example based on Aluminium itself resting on a layer 78 of piezoelectric material. The electrode 76 extends between two portions 79a, 79b of another electrode 79 arranged on the layer of piezoelectric material 78, with this other electrode 79 being for example also with a base of aluminium. The electrodes 76, 79 called "upper" electrodes for an interdigitated comb.

An oscillating electric field is applied able to generate contractions and expansions of the layer of piezoelectric material 78 at the origin of acoustic waves called Lamb waves. The layer of piezoelectric material 78 is arranged on a conductive layer 77, for example based on Mo which is typically connected to the mass.

This conductive layer 77 itself is arranged on an insulating layer 73, for example based on $SiO_2$.

The electrodes 76, 79, the layer of piezoelectric material 78, the conductive layer 77 and an insulating layer 73 form a block suspended above the cavity 71, with this block being laterally delimited by trenches 75a, 75b, arranged on either side of the block and which makes it possible to reflect the acoustic waves.

A functionalised porous material such as described hereinabove can be integrated into other types of chemical sensors other than those given hereinabove by way of example, in particular into sensors provided with a detection structure with a mechanical resonator with acoustic waves: in particular a SAW sensor, or a MEMS or NEMS sensor provided with a vibrating beam.

An example of the method of implementing a functionalised porous structure for chemical sensor shall now be given in liaison with FIGS. 8A-8B, 9A-9B, 10A-10B.

Figure 8A:
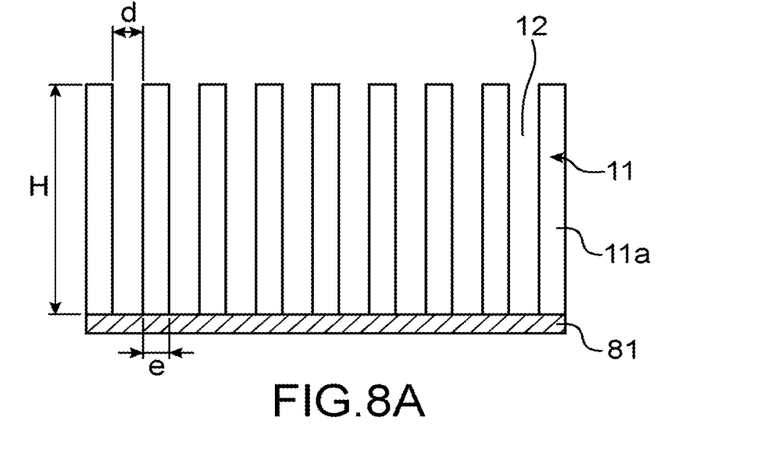
FIGS. 8A-8B show an example of a method for producing a porous structure integrating a functionalisation layer.

The starting material of the method can be a layer that is transformed into porous material 11.

At this stage, the layer that is desired to be made porous can have been structured, i.e. one or several patterns have been carried out in this layer for example using a method of photolithography.

The porous material can be for example alumina that is rendered porous by anodic oxidation (also called anodisation) of an aluminium layer.

The thickness of the aluminium layer, which can be for example several hundred nanometres is defined according to the height of the porous structure targeted taking account of the expansion coefficient of the layer during anodisation.

The diameter also called critical dimension d of the pores 12 of the structure is controlled with a method of anodisation that typically unfolds in four phases: a pre-anodisation, then a first etching that makes it possible to homogenise the diameter of the initiations of pores, then an anodisation followed by a second etching in order to enlarge the pores 12. The pre-anodisation and the anodisation are typically carried out by polarising the layer to be rendered porous in electrolyte baths such as phosphoric acid or oxalic acid under a constant voltage, for example 80V for the pre-anodisation and 80V for the anodisation, and at a given temperature of several degrees Celsius.

The two phases of etching are preferably carried out hot, at a temperature of about fifty degrees Celsius, for example using a phosphoric acid bath.

An example of the method of anodisation that can be used is given in the document: "Organized porous alumina membranes for high density silicon nanowires growth", by T. Bernardin, et al. Microelectronic Engineering, Volume 88, September 2011, Pages 2844-2847 Elsevier. According to the parameters of the chosen method of anodisation, when the porous material 11 is alumina pores 12 are formed for example that have a hexagonal organisation and a critical dimension d between several tens of nanometres and several hundred nanometres, for example about 300 nanometres, a height H that can be between several hundred nanometres and several micrometres, the pores able to be separated between them by regions 11a of thickness e that can be between 10 nm and several hundred nanometres, for example about 100 nm (FIG. 8A).

In order to prevent a porosification of the underlying layers at the layer that is desired to be made porous, and for example to prevent reaching an electrode region of the sensor whereon the functionalised porous structure is formed, it can be provided, as in FIG. 8A, an intermediate barrier layer 81 whereon the layer rendered porous is arranged. In the case where a porosification of aluminium is carried out, it a barrier layer 81 can be provided that resists an anodisation of the aluminium and for example based on Ti. The nature and the thickness of the barrier layer 81 are defined according to the compatibility with the stack whereon it is deposited and its selective behaviour with respect to the anodisation of the aluminium.

Figure 8B:
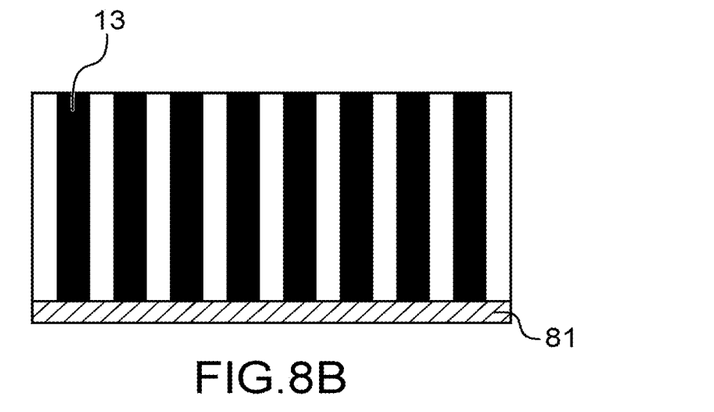

Once the porous structure is created, at least one functionalisation layer 13 is formed in the pores 12 able to adsorb or absorb at least one target chemical species, for example in the form of gas (FIG. 8B). The materials of the functionalisation layer that is desired to be formed can be an organic-inorganic hybrid material, or a microporous or nanoporous material, or a polymer material or more generally a material that is difficult to structure in particular by photolithography.

The porous material used as a receiving matrix at the functionalisation layer has a thickness and a well-defined shape.

According to an embodiment of the method a filling is carried out in the liquid phase of the porous material. The filling can be carried out by a dispense over the entire surface of the support or locally by screen printing, for example using a sol-gel solution. The topographical characteristics of the porous structure, in particular the surface state and the diameter of the pores 12, as well as the properties of the liquid deposition solution in terms of wettability and superficial surface tension are provided in such a way that the liquid uniformly fills the porous structure.

In the case of a porous material based on $Al_2O_3$ a pre-treatment is not necessarily carried out to prepare the filling. For other types of porous materials, a prior hydrophilic treatment can be implemented of the porous structure for example using a plasma. Then, a deposition of $SiO_2$ is carried out, or of a polymer of the chitosan or Polyetherimide (PEI) type in order to improve the catching.

Figure 9A:
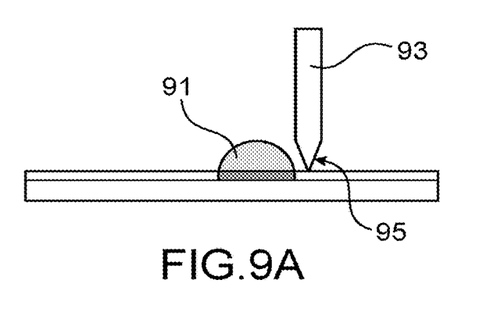
FIGS. 9A-9B show a first method of filling a porous structure by a functionalisation material.
Figure 9B:
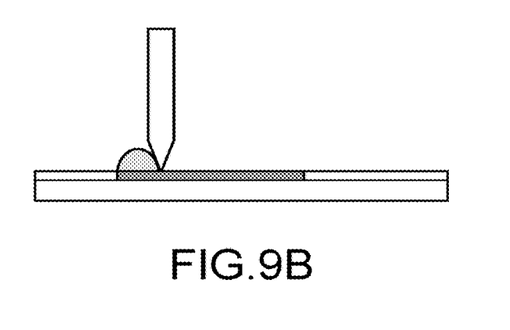

A particular method of filling the pores 12, that shall be called "scraping" is shown in FIGS. 9A-9B.

This method is similar to screen printing and comprises the deposition of a solution of interest 91 in order to form the functionalisation layer, then a spreading of this solution 91 by means of a scraper 93, for example made of polymer. The scraper 93 can be provided with an end 95 that has edges that have the shape of a V, i.e. creating an acute angle. In this case, the scraper 93 has a dual function. It makes it possible to spread the solution uniformly over the surface of the support whereon the deposition is carried out. The "V" shape of the end 95 of the scraper in contact with the support exerts a force on the solution that facilitates the filling of the pores 12. The scraper 93 also makes it possible to remove an excess of solution 91 that is sought to be eliminated on the surface of the support.

Figure 10A:
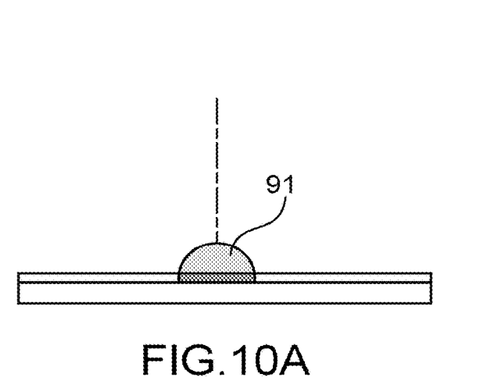
FIGS. 10A-10B show a second method of filing a porous structure by a functionalisation material.
Figure 10B:
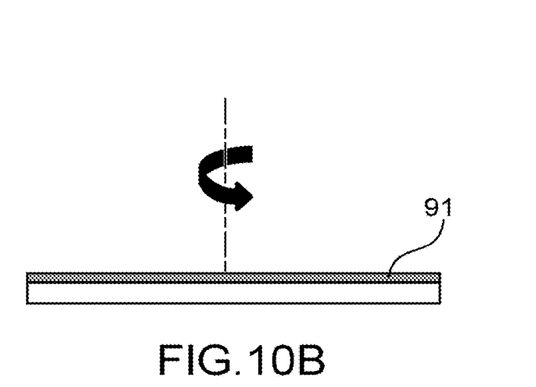

Another filling technique shown in FIGS. 10A-10B consists in carrying out a coating via centrifugation (spin coating).

This method of filling comprises the deposition of a solution of interest on a support that is rotated about its centre and the solution then spreads out using the centrifugal force. The final thickness depends on the properties of the solution and on parameters such as the acceleration of the support, the angular speed of the support, the duration of the rotation. The solution 91 is deposited at the centre of the support then a rotation is triggered, at a speed for example of about 2000 rpm for a duration that can be about 2 min. The solution 91 then spreads out over the support and penetrates into the pores 12.

A method such as described hereinabove makes it possible to form a detection structure provided with a porous material that while still having a controlled shape and thickness can integrate a material that is usually incompatible with photolithography, for example a polymer material or an organic-inorganic hybrid material.

According to an alternative embodiment of the method, it may be desired to integrate several functionalisation layers into the porous material, a pore of this material then able to comprise a stack of functionalisation layers.

Figure 11:
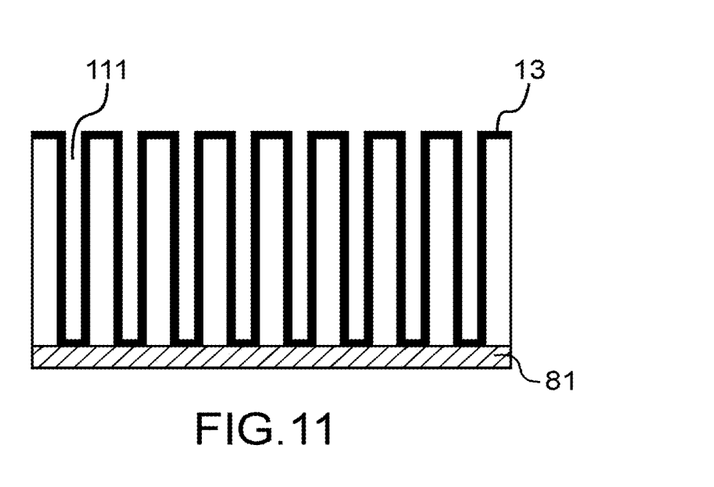
FIG. 11 shows a step of producing a functionalisation layer by compliant deposition on a porous structure.

In this case, a compliant deposition can be carried out of a first functionalisation layer 13 such as is shown in FIG. 11.

Such a deposition is more preferably carried out in the gas phase. The walls of the pores 12 can then be covered with a material that is sensitive to a first gas or a given first chemical species. The deposited material is for example a polymer such as FDTS (Perfluorodecyltrichlorosilane) or EBTMOS (3,4-epoxybutyltrimethoxysilane). The gas phase deposition on a porous structure makes it possible to generate a functionalisation layer with a substantial developed surface in relation to a smooth planar surface with a surface ratio varying from 1 to 100.

An alternative to the gas phase deposition is a liquid phase deposition of a solution diluted in a solvent, an evaporation of the solvent then being carried out.

The deposition is carried out such that the first functionalisation layer 13 covers the surface of the pores 12 and that an empty volume 111 is preserved.

It is then possible to fill at least this empty volume 111 with a second functionalisation layer in such a way as to obtain an arrangement such as shown in FIG. 2. This second functionalisation layer can be carried out in the liquid or gas phase according to one or the other of the techniques given hereinabove.

Then, an etching is carried out of the filling material or material deposited as excess and exceeding the surface of the porous material. Etching via RIE (for "Reactive Ion Etching") for example using $CHF_3$—$O_2$, in particular 100 sccm of $CHF_3$, 20 sccm of $O_2$ with an end-of-etching detection on the aluminium or on the alumina.

During the step of liquid phase or gas phase deposition in order to form the functionalisation layer or layers, it may be necessary to protect certain regions of the support whereon the porous material is located. Among the regions that may need to be protected are in particular the contact studs. When a liquid product is dispensed, a screen printing mask can be used as protection, while for carrying out a vapour phase deposition, a perforated mask can be used to reveal only certain zones of the porous material.

According to an alternative embodiment of the method, and in particular of the formation of the functionalisation layer by liquid phase deposition it can be provided to form hydrophobic regions on the porous material so as to favour the selective deposition of the liquid product on certain target zones of the porous material. The deposition of the functionalisation layer can be carried out via coating by centrifugation ("spin coating").

According to an alternative embodiment of the method, before anodisation of the layer that is desired to be rendered porous, a prior etching can be carried out of certain zones of this layer intended to be rendered porous by anodic oxidation, in particular when the layer is made of aluminium. This can make it possible to limit the final topography on the upper face of the layer of the porous material. The transformation of the aluminium into alumina results in an increase in volume of about 20% to 40% according to the voltage, the current, the temperature and the bath used. If only a localised zone of the aluminium is anodised, the alumina formed will be higher than the aluminium around the localised zone. In order to offset this, it is possible to etch beforehand the aluminium layer in the localised zone so as to remove a portion of one thickness corresponding to an estimated gain in volume.

A method according to the method can be applied to the forming of functionalised porous structures produced from porous materials other than alumina for example using porous Si.

An example of the functionalisation of porous material wherein a functionalisation layer is formed by compliant deposition on the walls of the pores then another functionalisation layer by volume deposition filling the pores was described hereinabove.

Figure 12A:
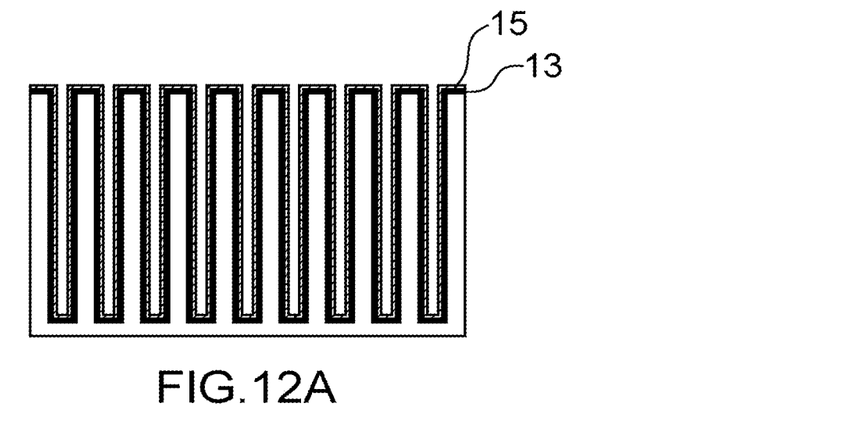
FIGS. 12A-12B show an alternative embodiment of a porous structure integrating several functionalisation layers.

It is also possible to fill the pores 12 with successive compliant depositions of several active materials 13, 15 in order to cover the walls and the bottom of the pores with a stack of functionalisation layers, while still maintaining a central empty volume (FIG. 12A).

Figure 12B:
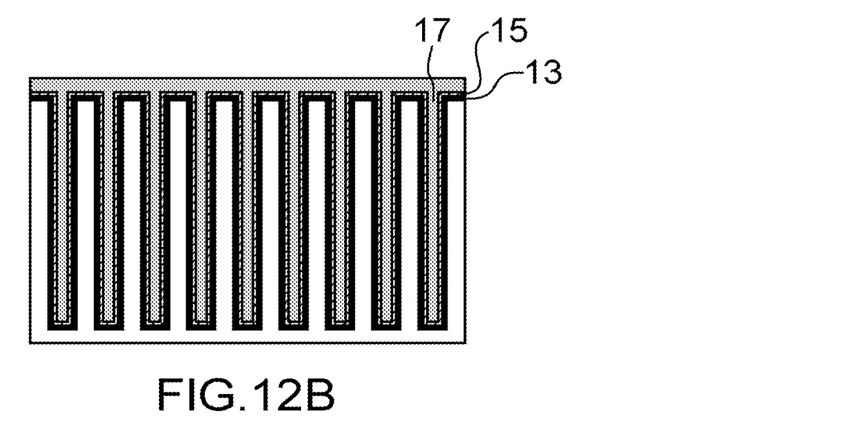

After such a succession of compliant depositions it is also possible to finalise the functionalisation and the filling of the pores 12 via a volume deposition of material 17 that makes it possible to fill in the remaining empty volume of the pores 12 (FIG. 12B).

Figure 13:
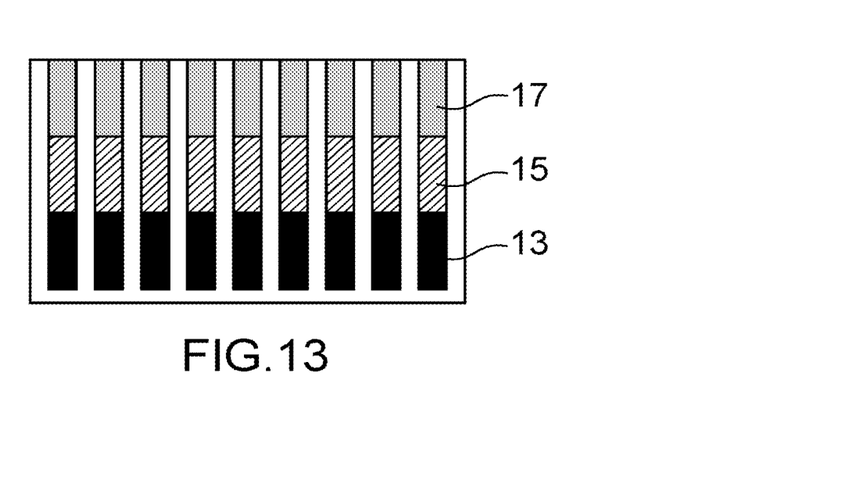
FIG. 13 shows an alternative arrangement of porous material with pores comprising several superimposed functionalisation layers.

Another alternative embodiment consists in depositing several active materials by volume in successive depositions alternating with plasma etchings in order to produce a stack of functionalisation layers 13, 15, 17 such as shown in FIG. 13, each one in contact with the walls of a pore 12.

The invention claimed is:

1. A chemical sensor comprising:
   at least one resonant detection structure, the detection structure including at least one receiving matrix based on a porous material of which the pores are covered or filled with at least one first functionalization layer based on a first microporous or nanoporous organic material provided to adsorb and/or absorb at least one first chemical species,
   the porous material being coated with a closure layer of the pores, the closure layer being arranged on or above the first functionalization layer and configured to allow one or plural chemical species to penetrate inside the pores and to prevent one or plural other chemical species from penetrating inside the pores.

2. The chemical sensor according to claim 1, the first organic material being chosen from the following materials: organic-inorganic hybrid material, polymer material.

3. The chemical sensor according to claim 1, wherein the pores are covered with the first functionalization layer and further filled at least partially with at least one second functionalization layer arranged on and in contact with the first functionalization layer, the second functionalization layer able to adsorb and/or absorb at least one second chemical species, the second functionalization layer being based on a second organic material, different from the first organic material.

4. The chemical sensor according to claim 3, the second material being chosen from the following materials: organic-inorganic hybrid material; microporous or nanoporous material having an organic function; polymer material.

5. The chemical sensor according to claim 3, wherein at least one among the functionalization layers is provided to adsorb and/or absorb $CO_2$, at least one other layer among the functionalization layers is provided to adsorb and/or absorb $H_2$.

6. The chemical sensor according to claim 1, the closure layer of the pores being hydrophobic.

7. The chemical sensor according to claim 1, wherein the first organic material has an organic function based on silane or based on microporous silica rendered organic.

8. A method for producing a chemical sensor according to claim 1, wherein the detection structure is provided with a layer of the porous material, the first functionalization layer is formed by liquid or gas phase deposition of a solution on all or a portion of the layer of porous material.

9. The method according to claim 8, further comprising, after liquid phase deposition, rotating a support on which the layer of porous material is arranged.

10. The method according to claim 8, further comprising, after liquid phase deposition, spreading the liquid solution by a scraper.

11. A method for producing a chemical sensor according to claim 1, wherein the detection structure includes a layer of the porous material, the first functionalization layer is formed by compliant deposition to cover all or a portion of the pores while leaving at least one empty volume in the pores, the pores being then at least partially filled or covered with a second material to form in the volume at least one second functionalization layer arranged on and in contact with the first functionalization layer.

12. A method for producing a chemical sensor according to claim 1, wherein a layer of the porous material is formed by anodic oxidation.

13. The method for producing a chemical sensor according to claim 12, wherein the layer of the porous material is formed by anodic oxidation of an aluminium layer, the aluminium layer being arranged on an oxidation barrier layer.

* * * * *